United States Patent
Okawa et al.

(10) Patent No.: US 8,964,336 B2
(45) Date of Patent: Feb. 24, 2015

(54) EASY AXIS HARD BIAS STRUCTURE

(75) Inventors: Norihiro Okawa, Odawara (JP); Koji Sakamoto, Odawara (JP); Koji Okazaki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/605,934

(22) Filed: Sep. 6, 2012

(65) Prior Publication Data
US 2014/0063647 A1 Mar. 6, 2014

(51) Int. Cl.
*G11B 5/39* (2006.01)

(52) U.S. Cl.
USPC ..................................... 360/324.12

(58) Field of Classification Search
USPC ............ 360/110, 324, 324.12, 327.3, 327.31, 360/327.32
See application file for complete search history.

(56) References Cited

U.S. PATENT DOCUMENTS

| | | | |
|---|---|---|---|
| 5,742,459 A * | 4/1998 | Shen et al. | 360/327.32 |
| 6,656,604 B2 | 12/2003 | Hasewaga | |
| 6,954,343 B2 * | 10/2005 | Larson et al. | 360/324.12 |
| 6,961,223 B2 * | 11/2005 | Hasegawa | 360/322 |
| 6,980,403 B2 * | 12/2005 | Hasegawa | 360/319 |
| 7,259,941 B2 | 8/2007 | Pinarbasi | |
| 7,446,987 B2 * | 11/2008 | Zhang et al. | 360/324.12 |
| 7,688,555 B2 | 3/2010 | Zhang et al. | |
| 7,804,668 B2 | 9/2010 | Zhou et al. | |
| 7,848,065 B2 * | 12/2010 | Freitag et al. | 360/324.12 |
| 7,876,537 B2 * | 1/2011 | Uesugi et al. | 360/324.12 |
| 8,049,998 B2 * | 11/2011 | Ohsawa et al. | 360/324 |
| 8,339,753 B1 * | 12/2012 | Okawa et al. | 360/324.12 |
| 8,385,025 B2 * | 2/2013 | Maat et al. | 360/324.12 |
| 8,437,106 B2 * | 5/2013 | Yanagisawa et al. | 360/319 |
| 8,490,279 B2 * | 7/2013 | Zhou et al. | 29/603.08 |
| 8,570,690 B2 * | 10/2013 | Okamura et al. | 360/324.12 |
| 8,611,054 B1 * | 12/2013 | Shang et al. | 360/324.12 |
| 2010/0276272 A1 | 11/2010 | Zheng et al. | |
| 2010/0330395 A1 * | 12/2010 | Zhang et al. | 428/813 |

OTHER PUBLICATIONS

Liu et al., "Magnetic Tunnel Junction Field Sensors With Hard-Axis Bias Field," 2002 American Institute of Physics, Journal of Applied Physics, vol. 92, No. 8, Oct. 15, 2002, pp. 4722-4725.
Yang et al., "A Micron-Sized GMR Sensor With a CoCrPt Hard Bias," 2010 Chinese Institute of Electronics, Journal of Semiconductors, vol. 31, No. 2, Feb. 2010, pp. 024005/1-024005/4.

* cited by examiner

*Primary Examiner* — Angel Castro
(74) *Attorney, Agent, or Firm* — Zilka-Kotab, PC

(57) ABSTRACT

In one embodiment, a magnetic head includes a sensor stack of thin films including a free layer; a hard bias structure comprising a first foundation layer, a second foundation layer formed on the first foundation layer and a hard bias layer formed above the second foundation layer, wherein portions of the first and second foundation layers positioned along a side wall of the sensor stack have a discrete island structure. Additional embodiments are also disclosed.

24 Claims, 9 Drawing Sheets

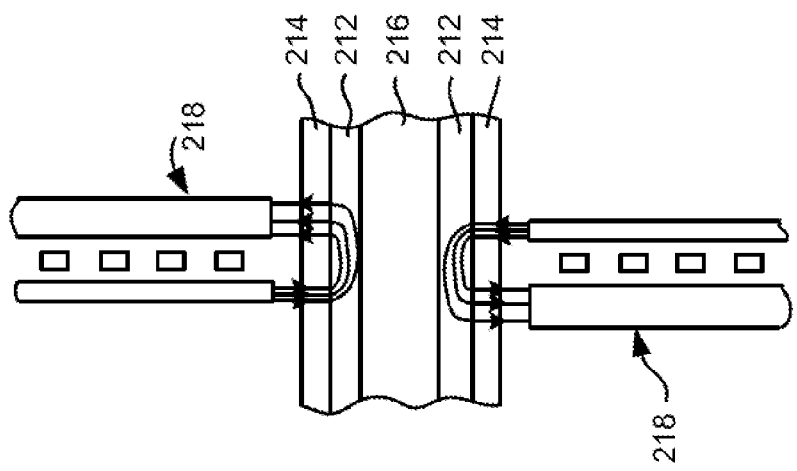
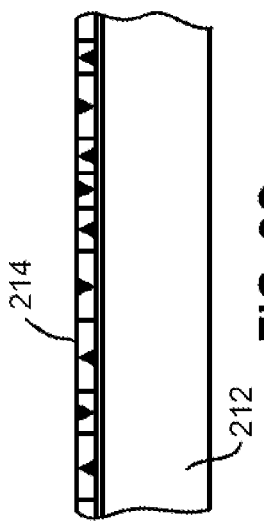
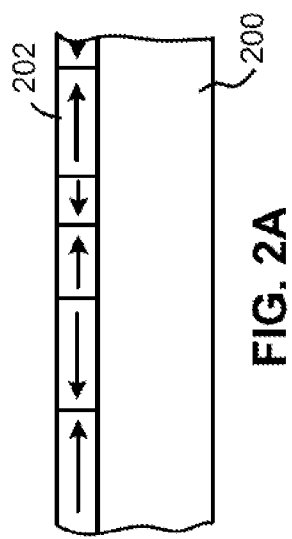
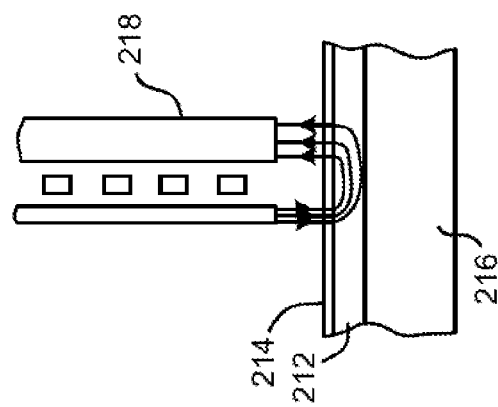
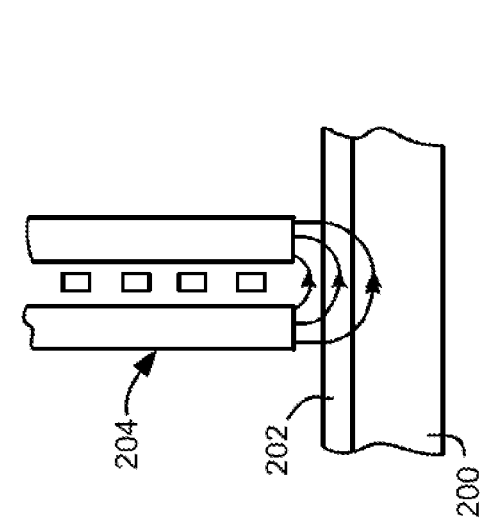

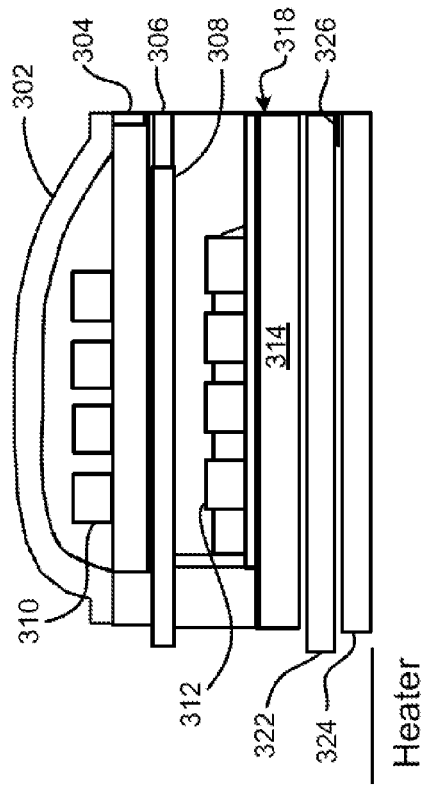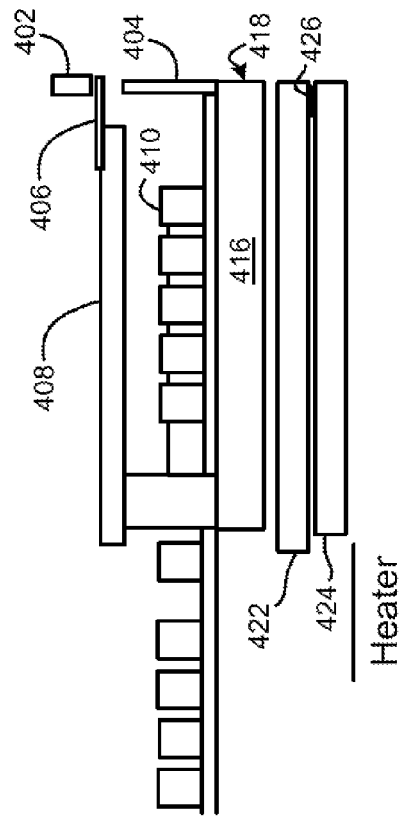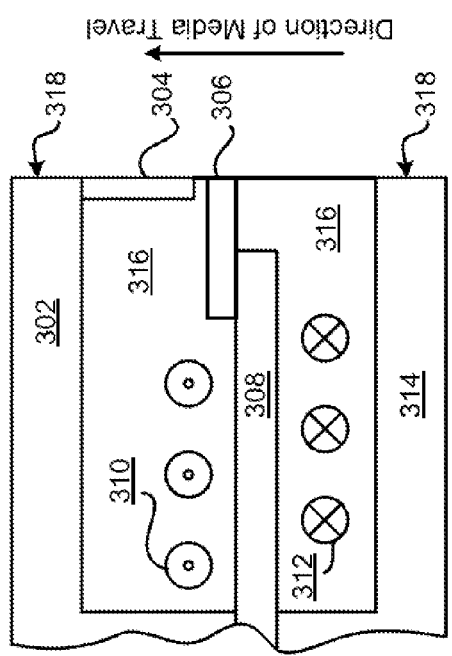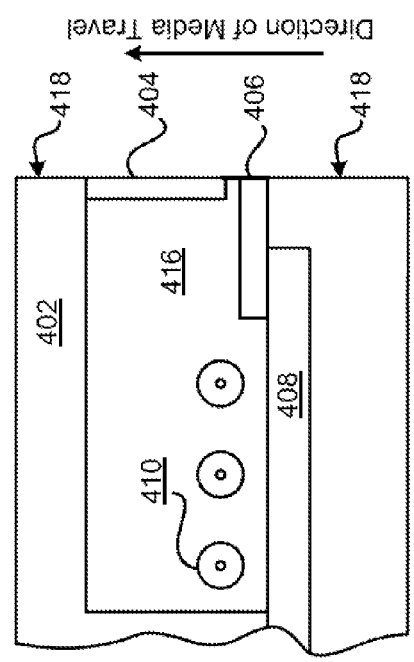

EASY AXIS HARD BIAS STRUCTURE

FIELD OF THE INVENTION

The present invention relates to data storage systems, and more particularly, this invention relates to a magnetic recording device implementing a tunneling magnetoresistive (TMR) sensor and an improved hard bias structure.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

Additionally, the read and write heads include a hard bias film, which constitutes a structure arranged on the end portion of a free layer, and applies a hard bias field (HBF) to the free layer. If the HBF is strong enough, the free layer is thereby formed as a single magnetic domain by the HBF, and run time noise is suppressed. However, when the HBF is weak, the free layer possesses varying magnetic domains, thereby generating undesirable run time noise, including Barkhausen noise.

The volume of information processing in the information age is increasing rapidly. In particular, HDDs have been desired to store more information in its limited area and volume. A technical approach to this desire is to increase the capacity by increasing the recording density of the HDD. To achieve higher recording density, further miniaturization of recording bits is effective, which in turn typically requires the design of smaller and smaller components. However, the further miniaturization of the various components presents its own set of challenges and obstacles.

Moreover, conventional attempts to increase recording densities have led to a size reduction of the read gap, which serves as a vertical magnetic shield interval, thereby inadvertently decreasing the HBF as well. Additionally, conventional attempts to increase recording densities have caused a reduction in the absorption of the HBF by the magnetic shield, also causing an undesirable decrease to the HBF. Thus it may be desirable to increase recording densities, while maintaining a HBF high enough to ensure a single magnetic domain free layer.

SUMMARY

In one general embodiment, a magnetic head includes a sensor stack of thin films including a free layer; a hard bias structure comprising a first foundation layer, a second foundation layer formed on the first foundation layer and a hard bias layer formed above the second foundation layer, wherein portions of the first and second foundation layers positioned along a side wall of the sensor stack have a discrete island structure.

In another general embodiment, a magnetic head includes a sensor stack of thin films including a free layer and a tunnel barrier layer; an insulating layer extending along a side wall of the sensor stack; a hard bias structure comprising a first foundation layer, a second foundation layer formed on the first foundation layer and a hard bias layer formed above the second foundation layer, wherein portions of the first and second foundation layers positioned along the side wall of the sensor stack have a discrete island structure, wherein a gap is present between the discrete island structure and horizontal portions of the first and second foundation layers.

In yet another general embodiment, a method for forming a magnetic head, comprising: forming a sensor stack of thin films above a substrate; forming a first foundation layer above the substrate and along a side wall of the sensor stack such that a portion of the first foundation layer along the side wall of the sensor stack is a discrete island; forming a second foundation layer on the first foundation layer such that first and second foundation layers positioned along a side wall of the sensor stack have a discrete island structure; and forming a hard bias layer above the second foundation layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

FIG. 5C is a method step for forming a magnetic head according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic head includes a sensor stack of thin films including a free layer; a hard bias structure comprising a first foundation layer, a second foundation layer formed on the first foundation layer and a hard bias layer formed above the second foundation layer, wherein portions of the first and second foundation layers positioned along a side wall of the sensor stack have a discrete island structure.

In another general embodiment, a magnetic head includes a sensor stack of thin films including a free layer and a tunnel barrier layer; an insulating layer extending along a side wall of the sensor stack; a hard bias structure comprising a first foundation layer, a second foundation layer formed on the first foundation layer and a hard bias layer formed above the second foundation layer, wherein portions of the first and second foundation layers positioned along the side wall of the sensor stack have a discrete island structure, wherein a gap is present between the discrete island structure and horizontal portions of the first and second foundation layers.

In yet another general embodiment, a method for forming a magnetic head, comprising: forming a sensor stack of thin films above a substrate; forming a first foundation layer above the substrate and along a side wall of the sensor stack such that a portion of the first foundation layer along the side wall of the sensor stack is a discrete island; forming a second foundation layer on the first foundation layer such that first and second foundation layers positioned along a side wall of the sensor stack have a discrete island structure; and forming a hard bias layer above the second foundation layer.

Figure 1:
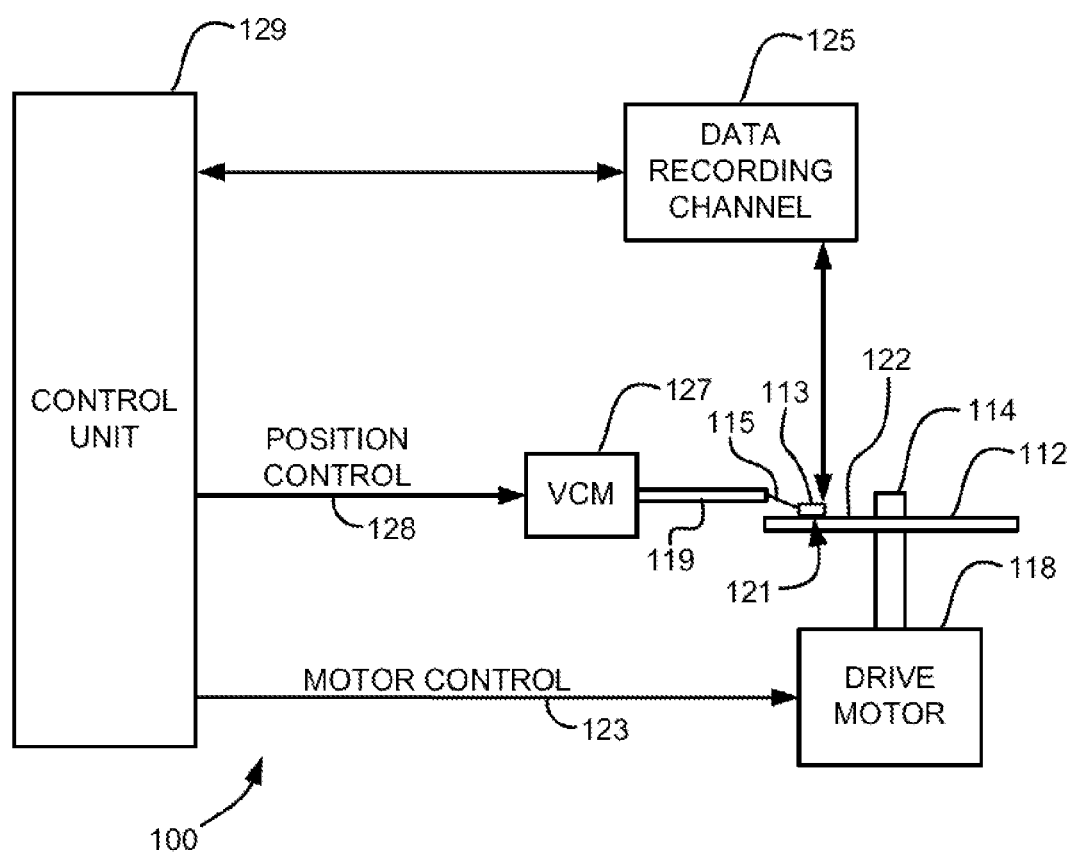
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by control unit 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air hearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Figure 5:
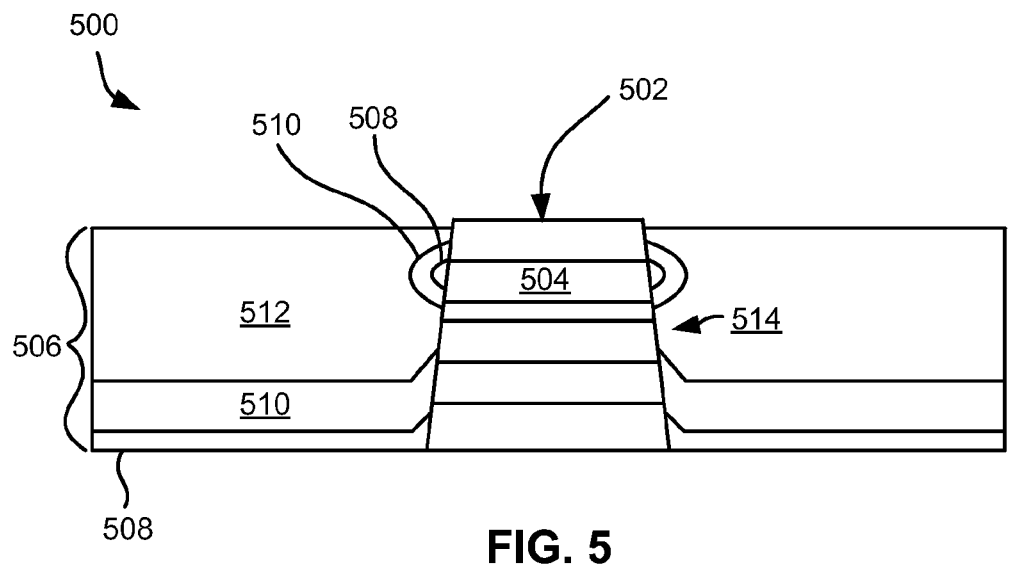
FIG. 5 is a cross-sectional view of a magnetic head according to one embodiment.

FIG. 5 depicts a magnetic head 500, in accordance with one embodiment. As an option, the present magnetic head 500 may be implemented in conjunction with features from any other embodiment listed herein, such as those described with reference to the other FIGS. Of course, however, such magnetic head 500 and others presented herein may be used in various applications and/or in permutations which may or may not be specifically described in the illustrative embodiments listed herein. Further, the magnetic head 500 presented herein may be used in any desired environment.

According to the illustrative embodiment depicted in FIG. 5, a magnetic head 500 is shown including a sensor stack 502 of thin films, including, but not limited to a free layer 504.

According to an illustrative embodiment, which is in no way intended to limit the invention, the sensor stack of thin films may additionally include a tunnel barrier layer. Thus, in a further approach, the magnetic head may incorporate an insulating layer extending along at least a portion of the side wall of the sensor stack (explained in further detail below).

With continued reference to FIG. 5, the magnetic head 500 additionally incorporates a hard bias structure 506, which includes a first foundation layer 508 and a second foundation layer 510. According to a preferred approach, which is in no way intended to limit the invention, the horizontal portion of the first and/or second foundation layer may be continuous. However, according to other approaches, the first and/or second foundation layers may be segmented, patterned, etc. or may incorporate any other desired configuration which would be apparent to one skilled in the art upon reading the present description.

As shown in FIG. 5, the second foundation layer 510 may preferably be formed above the first foundation layer 508. Depending on the desired embodiment, the first and second foundation layers 508, 510 may be separated by at least one, at least two, none, several, etc. intermediate layers of a type which would be apparent to one skilled in the art upon reading the present description.

As shown, the hard bias structure 506 additionally includes a hard bias layer 512, which may preferably be formed above the second foundation layer 510 as shown.

Figure 6A:
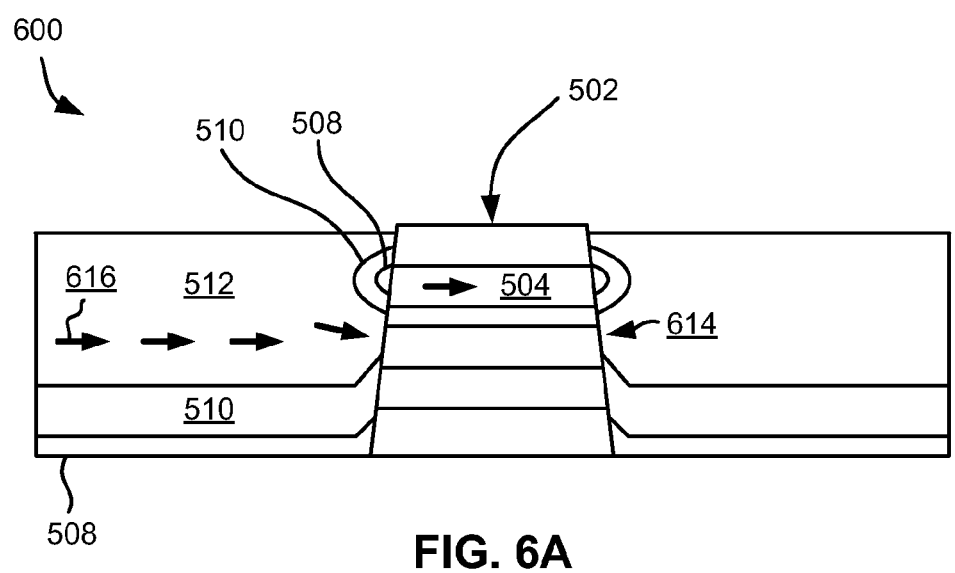
FIG. 6A is a cross-sectional view of a magnetic head according to one embodiment.
Figure 6B:
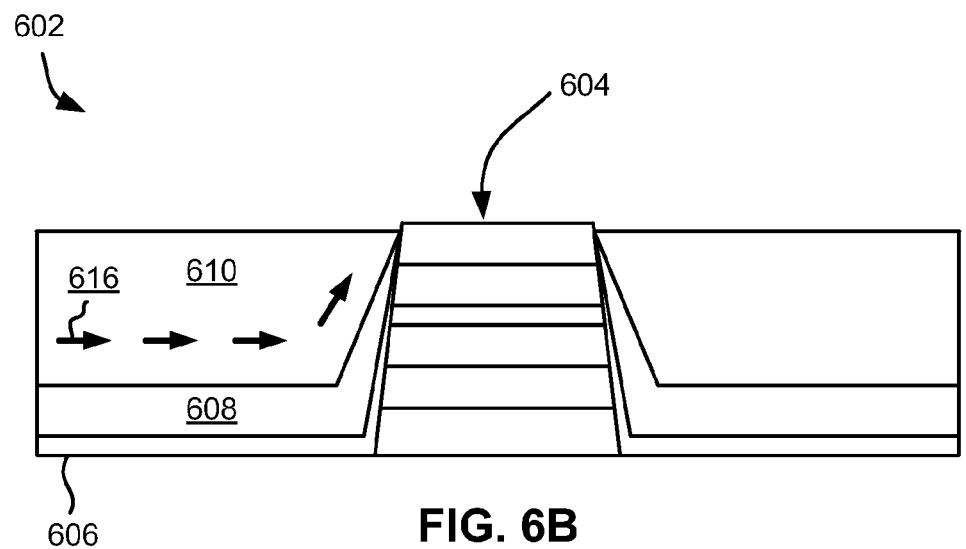
FIG. 6B is a cross-sectional view of a magnetic head according to a conventional embodiment.

Moreover, portions of the first and second foundation layers 508, 510 positioned along a side wall of the sensor stack may preferably incorporate a discrete island structure as shown, rather than contiguous structures (see 608 and 610 of FIG. 6B). According to various other approaches, there may be at least one, at least two, multiple, etc. discrete island structures positioned along the side wall, depending on the desired embodiment.

Thus, in a preferred approach, a gap 514 may be present between the discrete island structure and horizontal portions of the first and second foundation layers 508, 510 as shown in FIG. 5. In another approach, a gap may be present between the discrete island structure and at least the second foundation layer 510.

At least the second foundation layer 510 is absent in the gap 514. The first foundation layer 508 may present or absent in the gap 514 in this and/or other embodiments described herein.

According to one approach, the portion of the first foundation layer positioned along the side of the sensor stack, incorporating a discrete island structure, may act as a growth nucleus for the second foundation layer. In one approach, which is in no way intended to limit the invention, the portion of the first foundation layer may act as a growth nucleus for the second foundation layer if the first foundation layer incorporates a thin thickness in a direction of film growth. According to various approaches, the thin thickness, in a direction of film growth, of the first foundation layer may preferably be between about 0.2 nm and about 0.1 nm, but may be higher or lower depending on the desired embodiment.

FIG. 6A depicts a magnetic head 600, in accordance with one embodiment. As an option, the present magnetic head 600 may be implemented in conjunction with features from any other embodiment listed herein, such as those described with reference to the other FIGS. Of course, however, such magnetic head 600 and others presented herein may be used in various applications and/or in permutations which may or may not be specifically described in the illustrative embodiments listed herein. Further, the magnetic head 600 presented herein may be used in any desired environment.

Referring now to FIG. 6A, according to an illustrative embodiment, the first and second foundation layers 508, 510 of the magnetic head 600 are shown as having horizontal portions lying along the bottom of the structure depicted, as well as in discrete island structures at the side wall of the sensor stack 502 of thin films. The resulting gap 614 between the discrete island structure and horizontal portions of the first and second foundation layers allows the easy axis of magnetization of the end portion of the hard bias layer 512 positioned closest to the sensor stack 502 to be oriented about horizontally as indicated by the arrows 616. According to a preferred embodiment, the about horizontal orientation of the easy axis of magnetization may be in the same or similar direction as that of magnetization of the free layer. As a result, the about common direction of magnetization between the easy axis of magnetization and magnetization of the free layer may thereby favourably increase the achievable HBF. Increases made to the HBF encourage the free layer to be formed as a single magnetic domain, thereby suppressing run time noise. Thus, reading and/or writing quality is improved and run time errors are minimized.

Moreover, the fabrication of the first and second foundation layers, while incorporating discrete island structures according to a preferred embodiment, may also afford a measure of control over the crystal orientation of the hard bias film, thereby further increasing the achievable HBF.

Conversely, referring now to FIG. 6B, conventional designs of magnetic heads 602, include contiguous structures 606, 608 which orient the easy axis of magnetization of an end portion of the hard bias layer 610 positioned closest to the sensor stack 604 in a direction about perpendicular to that of the magnetization of the free layer as indicated by the arrows. Therefore, the achievable HBF is decreased, allowing the free layer to possess varying magnetic domains, thereby generating undesirable run time noise. Thus reading and/or writing quality is degraded, resulting in an unfavorable and inefficient magnetic head.

Figure 7:
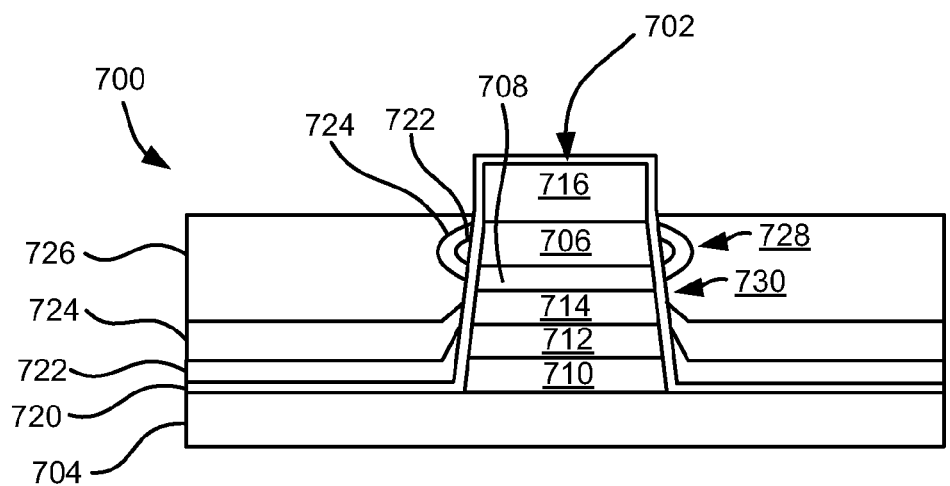
FIG. 7 is a cross-sectional view of a magnetic head according to one embodiment.

FIG. 7 depicts a magnetic head 700, in accordance with one embodiment. As an option, the present magnetic head 700 may be implemented in conjunction with features from any other embodiment listed herein, such as those described with reference to the other FIGS. Of course, however, such magnetic head 700 and others presented herein may be used in various applications and/or in permutations which may or may not be specifically described in the illustrative embodiments listed herein. Further, the magnetic head 700 presented herein may be used in any desired environment.

Referring to the embodiment depicted in FIG. 7, a magnetic head 700 includes a sensor stack 702 of thin films above a substrate 704, including a free layer 706 and a tunnel barrier layer 708. According to various approaches, the free layer may include NiFe, CoFe, Fe, etc., but may incorporate any material which would be apparent to one skilled in the art upon reading the present description or combinations thereof.

According to various embodiments, the sensor stack 702 of thin films may include any configuration known in the art. However, according to the exemplary embodiment depicted in FIG. 7, which is in no way intended to limit the invention, the sensor stack 702 of thin films may additionally include a seed layer 710, an antiferromagnetic (AFM) layer 712, a pinned layer 714, and a cap layer 716. Moreover, according to other approaches, the sensor stack of thin films may incorporate fewer or more layers, depending on the desired embodiment.

In a preferred approach, the seed layer 710 may modify the crystallographic texture or grain size of subsequent layers formed above the seed layer. However, in some approaches, the seed layer may not be included in the sensor stack, depending on the subsequent layers and/or the desired embodiment. According to various approaches, the seed layer may include any material which would be apparent to one skilled in the art upon reading the present description.

In a preferred embodiment, the antiferromagnetic (AFM) layer 712 may fix the magnetization direction of the pinned layer 714 due to exchange coupling, to preferably prevent variation caused by external magnetic fields experienced during read and/or write time. In different approaches, the antiferromagnetic (AFM) layer 712 may include, but is in no way limited to PtMn, NiO, Fe—Mn, etc., but may include any material which would be apparent to one skilled in the art upon reading the present description.

According to various other approaches, the pinned layer 714 may include NiFe, $CoFe_{10}$ (90% Co, 10% Fe), $CoFe_{50}$ (50% Co, 50% Fe), etc., but may include any other materials which would be apparent to one skilled in the art upon reading the present description. Moreover, according to other various approaches, the cap layer 716 may include Ta, a Ta/Ru stack, etc., or any other materials which would be apparent to one skilled in the art upon reading the present description, or combinations thereof.

With continued reference to FIG. 7, the magnetic head 700 additionally includes an insulating layer 720 extending along a side wall of the sensor stack 702. As described above, the insulating layer may prevent the current, which runs through the sensor stack of thin films, from being shorted to the hard bias structure (described immediately below).

The magnetic head 700 additionally includes a hard bias structure which may include a first and/or second foundation layer 722, 724. As shown, the second foundation layer 724 may preferably be formed above the first foundation layer 722, but could be separated therefrom as described above. Moreover, the hard bias structure is shown as including a hard bias layer 726 which may be formed above the second foundation layer 724 according to a preferred approach.

With continued reference to FIG. 7, portions of the first and second foundation layers positioned along the side wall of the sensor stack and spaced therefrom by the insulating layer 720 are shown having a discrete island structure 728 rather than a contiguous structure as seen in FIG. 6B. As a result, a gap 730 may be present between the discrete island structure 728 and horizontal portions of the first and second foundation layers 722, 724 as shown in FIG. 7, thereby improving the HBF.

Methods for forming the various embodiments described and/or suggested herein may include a wide range of process steps. FIGS. 8A-8I depict a method for forming a magnetic head 800, in accordance with one embodiment. As an option, the present method 800 may be implemented in conjunction with features from any other embodiment listed herein, such as those described with reference to the other FIGS. Of course, however, such method for forming a magnetic head 800 and others presented herein may be used in various applications and/or in permutations which may or may not be specifically described in the illustrative embodiments listed herein. Further, the method for forming a magnetic head 800 presented herein may be used in any desired environment.

FIGS. 8A-8I depict a method of forming a magnetic head 800 according to an illustrative embodiment. As shown, the method includes forming a sensor stack 802 of thin films above a first substrate 804. According to various embodiments, the sensor stack of thin films may include any configuration known in the art. However, according to the exemplary embodiment shown, which is in no way intended to limit the invention, the sensor stack 802 of thin films may include a seed layer 806, an antiferromagnetic (AFM) layer 808, a pinned layer 810, a tunnel barrier layer 812, a free layer 814 and a cap layer 816. Moreover, according to other approaches, the sensor stack of thin films may incorporate fewer or more layers, depending on the desired embodiment.

Figure 8A:
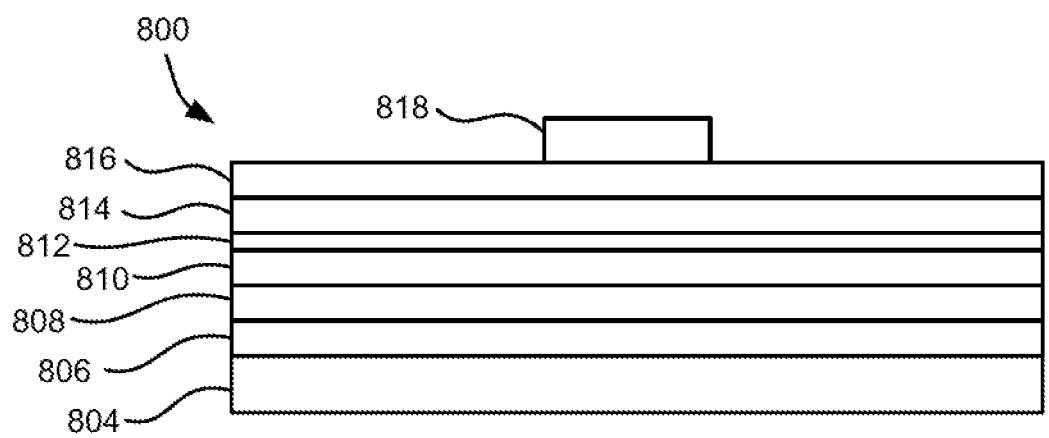
FIG. 8A is a method step for forming a magnetic head according to one embodiment.

With reference to FIG. 8A, according to a preferred approach, forming the sensor stack 802 of thin films above a first substrate 804 may include first applying the thin films, full film above the first substrate 804. According to various approaches, the first substrate may include a lead, a shield, etc. or any other material which would be apparent to one skilled in the art upon reading the present description.

With continued reference to FIG. 8A, a mask 818 may also be applied above the full film thin films, such that a milling process may be applied to define the sensor width.

Figure 8B:
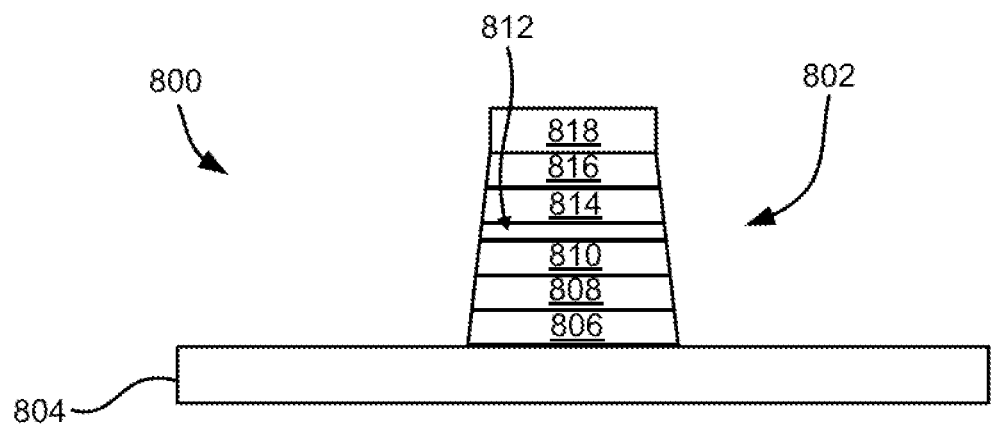
FIG. 8B is a method step for forming a magnetic head according to one embodiment.

As depicted in FIG. 8B, the portions of the thin films not protected by the mask 818 may be milled down to the first substrate 804, thereby forming the sensor stack 802 of thin films. However, according to various other approaches, the sensor stack of thin films may be formed by incorporating physical vapor deposition (PVD), sputtering, atomic layer deposition (ALD), chemical vapor deposition (CVD), etc. or other methods which would be apparent to one skilled in the art upon reading the present description; or combinations thereof.

Figure 8C:
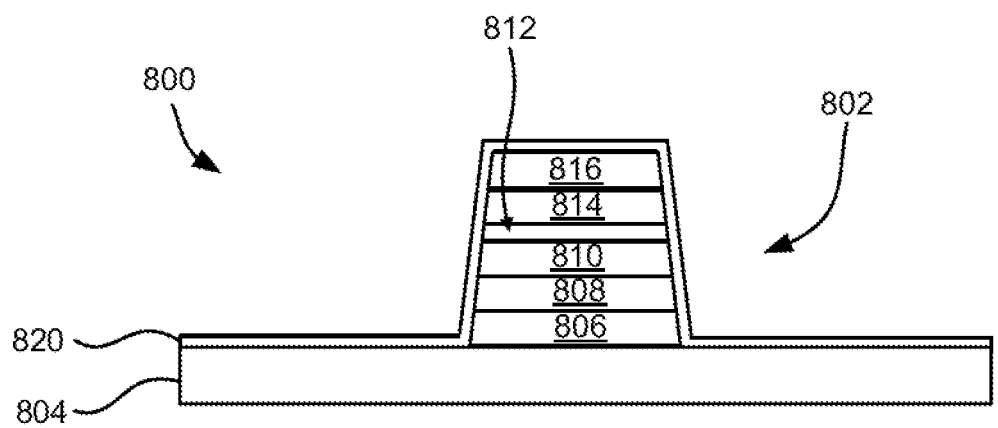
FIG. 8D is a method step for forming a magnetic head according to one embodiment.
FIG. 8E is a method step for forming a magnetic head according to one embodiment.
FIG. 8F is a method step for forming a magnetic head according to one embodiment.
FIG. 8G is a method step for forming a magnetic head according to one embodiment.
FIG. 8H is a method step for forming a magnetic head according to one embodiment.
FIG. 8I is a method step for forming a magnetic head according to one embodiment.

Referring now to FIG. 8C, after the milling process has formed the sensor stack of films, an insulating layer 820 may optionally be deposited over the sensor stack 802 and first substrate 804, depending on the desired embodiment. As described above, the insulating layer may be incorporated to preferably insulate the hard bias structure and prevent shorting of the current which may run through the sensor stack during operation. According to various approaches, the insulating layer may include alumina, quartz, silicon, feldspar, alloys, etc.; etc. or any other electrically insulating materials which would be apparent to one skilled in the art upon reading the present description.

Figure 8D:
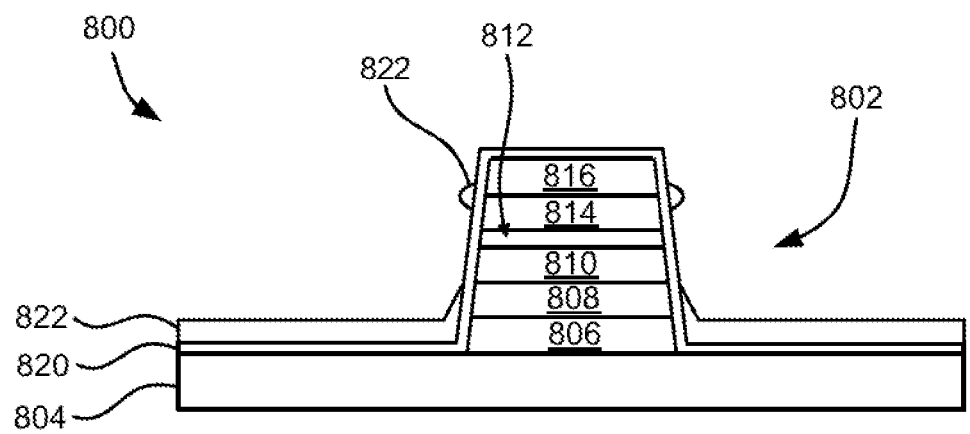

With reference to FIG. 8D, after the insulating layer 820 has been deposited, a first foundation layer 822 may be formed above the first substrate 804 and insulating layer 820. As shown, the first foundation layer 822 may preferably be formed along a side wall of the sensor stack 802 such that a portion of the first foundation layer 822 along the side wall of the sensor stack 802 is a discrete island. Detailed examples of methods to form such discrete islands are explained below.

According to various approaches, the first foundation layer may include NiTa, CrMo, CoCrPt, Cr, NiFe, etc. or the like, and including alloys and/or combinations thereof. According to one approach, after the first foundation layer 822 is formed, it may be oxidized by any process known in the art, including, but not limited to incorporating $Ar—O_2$ gas.

Figure 8E:
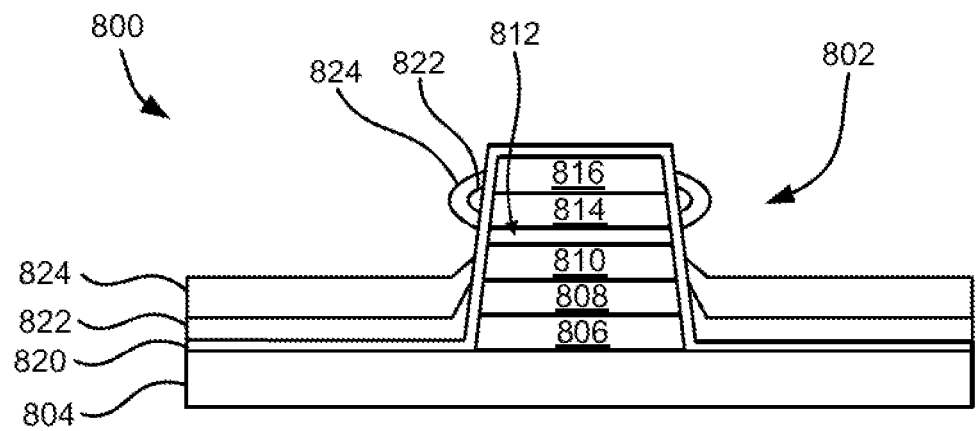

Referring now to FIG. 8E, a second foundation layer 824 may be formed above the first foundation layer 822, preferably such that first and second foundation layers 822, 824 positioned along a side wall of the sensor stack 802 incorporate a discrete island structure rather than a contiguous structure with their lower portions. As described above, according to one approach, the first foundation layer 822 positioned along the side of the sensor stack as a discrete island structure may act as a growth nucleus for the second foundation layer 824.

Figure 8F:
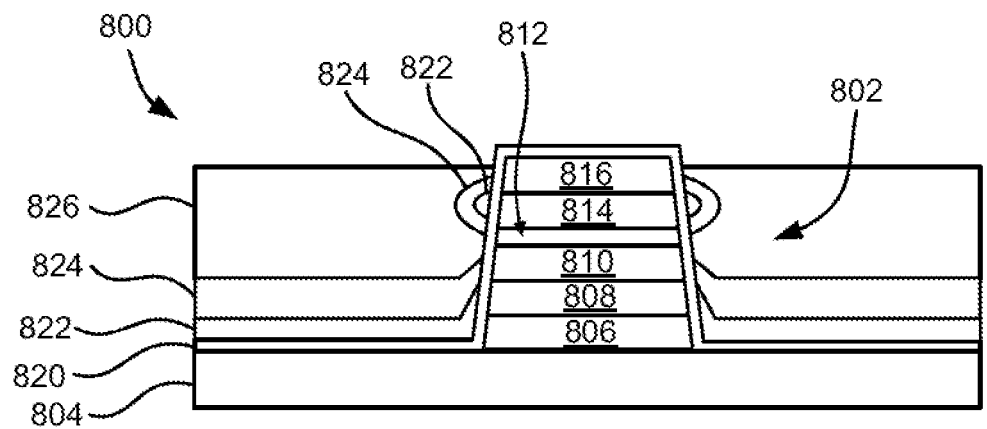

As shown in FIG. 8F, a hard bias layer 826 may be formed above the second foundation layer 824 by incorporating any material, process and/or method known in the art, which would be apparent to one skilled in the art upon reading the present description. In one approach, the hard bias layer 826 may include, but in no way is limited to including CoCrPt.

According to the exemplary embodiment depicted in FIGS. 8A-8I, the hard bias layer may incorporate a preferable magnetization orientation. As described above, the discrete island structure of the first and second foundation layers 822, 824 induces an easy axis of magnetization of an end portion of the hard bias layer positioned closest to the sensor stack to be oriented about in a direction of the magnetization of the free layer. This may preferably reduce the noise experienced during operation while reading and/or writing, thereby allowing the HBF to be increased while maintaining desirable run time conditions.

Figure 8G:
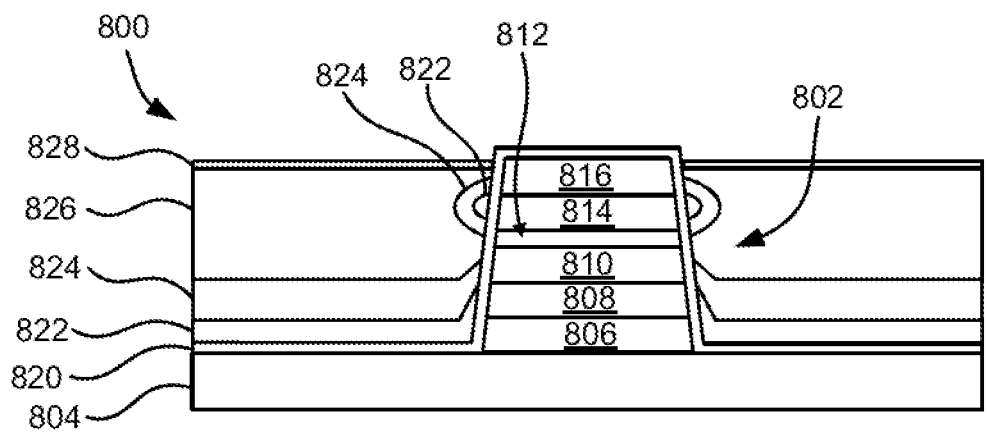
Figure 8H:
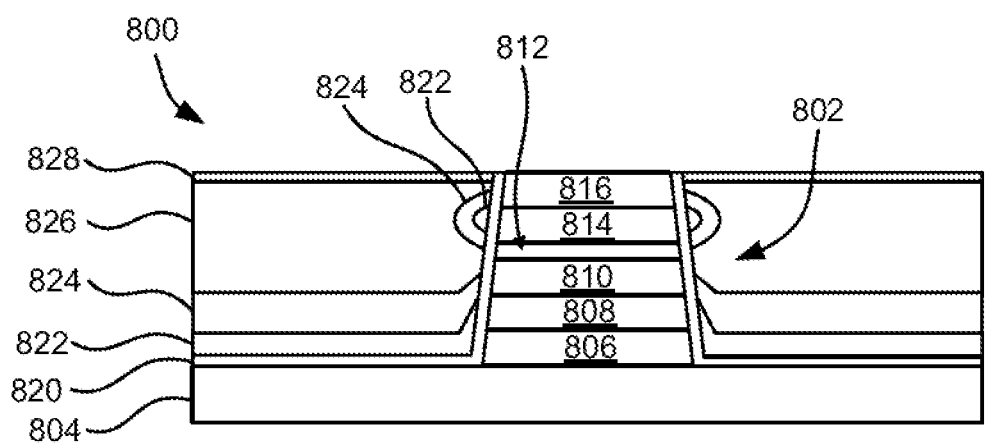

As shown in FIG. 8G, after the hard bias layer 826 is formed, a protective layer 828 may be applied above the hard bias layer 826. In various approaches, the protective layer 828 may include Ta, Cr, etc. or any other material which would be apparent to one skilled in the art upon reading the present description.

Figure 8I:
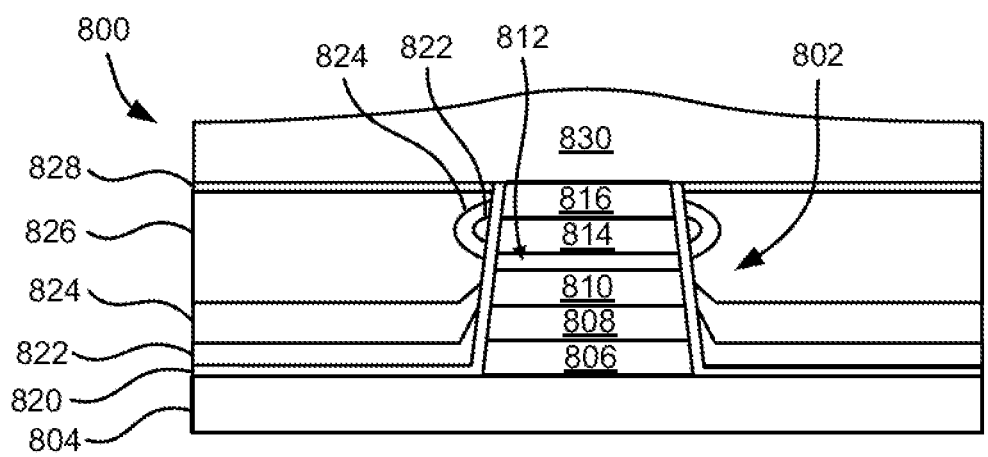

With continued reference to FIG. 8I, after the protective layer 828 is applied, and if not already done, the mask and any overlying layers may be removed from the sensor stack using a known process.

With reference to FIG. 8I, an upper layer 830 may be formed above the protective layer 828 and the sensor stack 802. According to various approaches, the upper layer may include the same or similar materials to those of the first substrate, but may incorporate any material which would be apparent to one skilled in the art upon reading the present description, or combination thereof. In an illustrative embodiment, the substrate 804 and upper layer 830 are shields, e.g., of CoFe, NiFe, etc.

Figure 9:
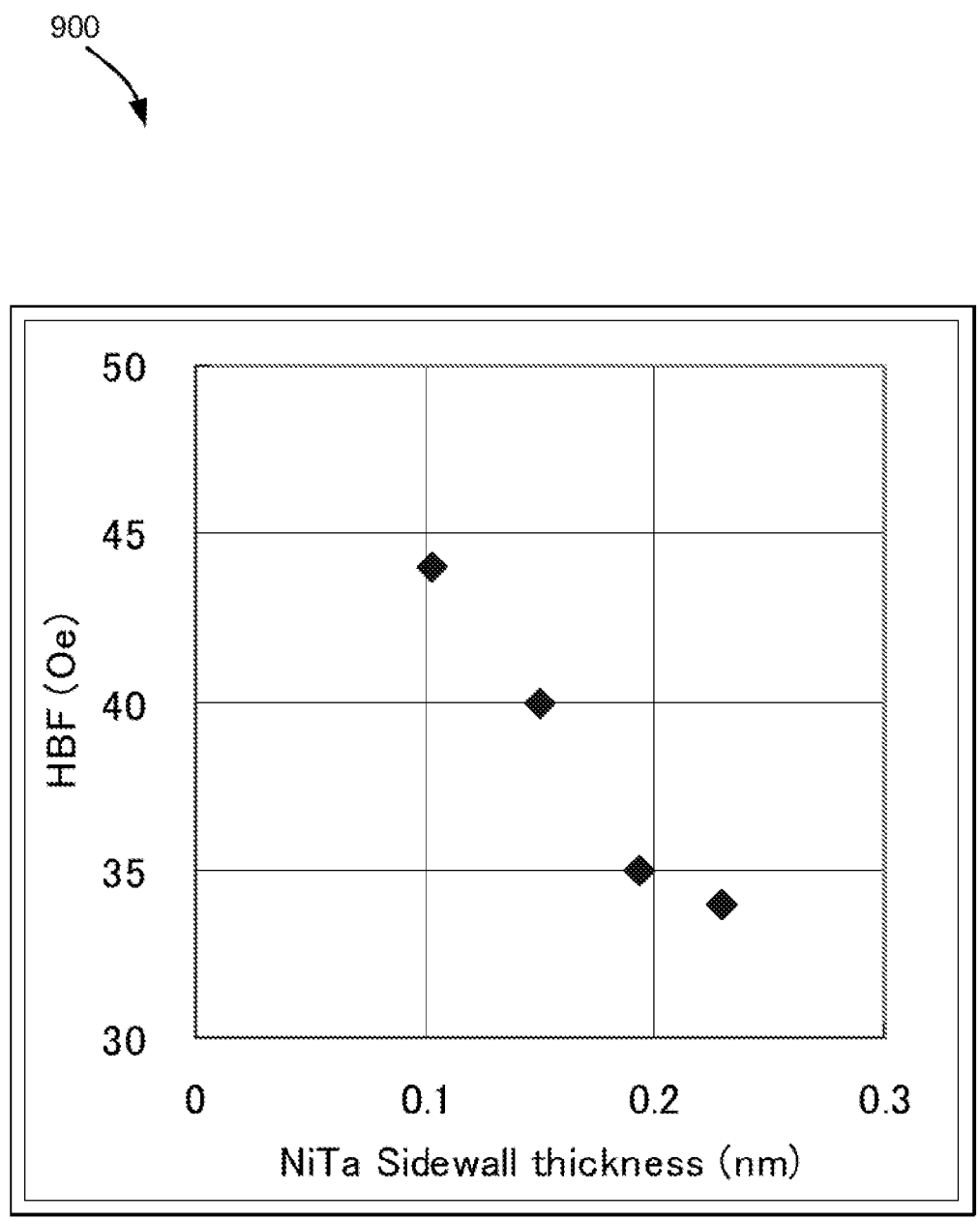
FIG. 9 is a graph depicting the hard bias field dependency on layer thicknesses.

Referring now to FIG. 9, a graph 90e depicts the HBF dependency on the first foundation layer's thickness at the side surface of the sensor stack according to an exemplary embodiment. The exemplary embodiment, which is in no way meant to limit the invention, includes a magnetic head formed by a method similar and/or the same as that depicted in FIGS. 8A-8I. Moreover, the magnetic head tested with regard to the results plotted in FIG. 9 included a NiTa first foundation layer and a CrMo second foundation layer.

With continued reference to FIG. 9, the graph clearly depicts that as the film thickness of the first foundation layer at the side surface of the sensor stack is varied, the HBF is directly affected. As shown, the thinning of the NiTa first foundation layer from the conventional film thickness of 0.23 nm (i.e. conventional contiguous structures) to 0.1 nm, the HBF significantly increased from 34Oe to 44Oe.

This thinning of the first foundation layer to about 0.1 nm results in the formation of the discrete island structures rather described herein. As previously mentioned and shown by the experimental data graphed in FIG. 9, the discrete island structures effectively orient the easy axis of magnetization towards the free layer which, in turn, greatly increase the HBF of the magnetic head.

According to various embodiments the first and second foundation layers positioned along a side wall of the sensor stack have a discrete island structures may be formed by any of a variety of methods and/or processes.

In one embodiment, a magnetic head having contiguous first and second foundation layers (e.g., 606 and 608 of FIG. 6B) may incorporate an oxidization process. According to the embodiment, the contiguous first and second foundation layers may be preferentially oxidized such that only portions other than the horizontal and discrete island portions of the contiguous first and second foundation layers are oxidized. Then a selective removal process may be applied to remove only the oxidized portions of the first and second foundation layers, thereby leaving the horizontal portions and the preferential discrete island portions in place.

In another illustrative embodiment, a magnetic head having contiguous first and second foundation layers (e.g., 606 and 608 of FIG. 6B) may incorporate an etching agent. According to the embodiment, an etching agent may be applied to the contiguous first and second foundation layers by immersion up to a desired position along the height of the sensor stack. Thus, upon being applied, the etching agent may begin to etch the contiguous first and second foundation layers until the portion between the horizontal portions and the preferential island portions of the contiguous first and second foundation layers (e.g., in the gap region 614 of FIG. 68) has been etched away. Thereafter, the etching agent may be removed such that etching of the layers is stopped.

As a result, a gap may preferably be formed, thereby creating discrete island structures and horizontal portions of the first and second foundation layers. However, by fully applying an etching agent up to a desired position along the height of the sensor stack, the horizontal portions of the first and second foundation layers may also be exposed and etched by such etching agent. Therefore, it may be preferable to incorporate first and/or second foundation layers with an increased thickness of the horizontal portions, such that the etching agent may not fully etch the horizontal portion of the first and/or second foundation layers. Rather, after the etching agent is removed, the horizontal thickness of the first and/or second foundation layers may preferably be reduced to the desired range of about 0.2 nm to about 0.1 nm as described above. According to different embodiments, various other methods and/or process steps may be incorporated to form the preferential discrete island structures, including, but not limited to preferential etching.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head, comprising:
a sensor stack of thin films including a free layer;
a hard bias structure comprising a first foundation layer, a second foundation layer formed on the first foundation layer and a hard bias layer formed above the second foundation layer,
wherein portions of the first and second foundation layers positioned along a side wall of the sensor stack have a discrete island structure, wherein a film thickness of the portion of the first foundation layer is not less than 0.1 nm,
wherein the discrete island structure is sandwiched between the hard bias layer and the side wall of the sensor stack.

2. The magnetic head as recited in claim 1, wherein a horizontal portion of the second foundation layer is continuous.

3. The magnetic head as recited in claim 1, wherein the portion of the first foundation layer positioned along the side of the sensor stack is a growth nucleus for the second foundation layer.

4. The magnetic head as recited in claim 1, wherein a gap is present between the discrete island structure and horizontal portions of the first and second foundation layers.

5. The magnetic head as recited in claim 1, further comprising an insulating layer extending along the side wall of the sensor stack, wherein the sensor stack includes a tunnel barrier layer.

6. The magnetic head as recited in claim 1, wherein a film thickness of the first foundation layer at the position along the side wall of the sensor stack is not greater than 0.2 nm.

7. The magnetic head as recited in claim 6, wherein the film thickness is not less than 0.1 nm.

8. The magnetic head as recited in claim 1, wherein
the first foundation layer includes a material selected from a group consisting of NiTa, CrMo, CoCrPt, Cr and NiFe.

9. The magnetic head as recited in claim 1,
wherein an easy axis of magnetization of an end portion of the hard bias layer positioned closest to the sensor stack is oriented in about a direction of magnetization of the free layer.

10. A magnetic data storage system, comprising:
at least one magnetic head as recited in claim 1;
a magnetic medium;
a drive mechanism for passing the magnetic medium over the at least one magnetic head; and
a controller electrically coupled to the at least one magnetic head for controlling operation of the at least one magnetic head.

11. A magnetic head, comprising:
a sensor stack of thin films including a free layer and a tunnel barrier layer;
an insulating layer extending along a side wall of the sensor stack;
a hard bias structure comprising a first foundation layer, a second foundation layer formed on the first foundation layer and a hard bias layer formed above the second foundation layer,
wherein portions of the first and second foundation layers positioned along the side wall of the sensor stack have a discrete island structure, wherein a film thickness of the portion of the first foundation layer is not less than 0.1 nm,
wherein a gap is present between the discrete island structure and horizontal portions of the first and second foundation layers,
wherein the discrete island structure is sandwiched between the hard bias layer and the side wall of the sensor stack.

12. The magnetic head as recited in claim 11,
wherein the portion of the first foundation layer positioned along the side of the sensor stack is a growth nucleus for the second foundation layer.

13. The magnetic head as recited in claim 11,
wherein a film thickness of the first foundation layer at the position along the side wall of the sensor stack is not greater than 0.2 nm and not less than 0.1 nm.

14. The magnetic head as recited in claim 11, wherein the first foundation layer includes a material selected from a group consisting of NiTa, CrMo, CoCrPt, Cr and NiFe.

15. The magnetic head as recited in claim 11, wherein an easy axis of magnetization of an end portion of the hard bias layer positioned closest to the sensor stack is oriented in about a direction of magnetization of the free layer.

16. A magnetic data storage system, comprising:
at least one magnetic head as recited in claim 11;
a magnetic medium;
a drive mechanism for passing the magnetic medium over the at least one magnetic head; and
a controller electrically coupled to the at least one magnetic head for controlling operation of the at least one magnetic head.

17. A method for forming a magnetic head, comprising:
forming a sensor stack of thin films above a substrate;
forming a first foundation layer above the substrate and along a side wall of the sensor stack such that a portion of the first foundation layer along the side wall of the sensor stack is a discrete island;
forming a second foundation layer on the first foundation layer such that portions of the first and second foundation layers positioned along a side wall of the sensor stack have a discrete island structure; wherein a film thickness of the portion of the first foundation layer is not less than 0.1 nm and
forming a hard bias layer above the second foundation layer, the discrete island structure being positioned between the hard bias layer and the sensor stack.

18. The method as recited in claim 17, wherein the portion of the first foundation layer positioned along the side of the sensor stack is a growth nucleus for the second foundation layer.

19. The method as recited in claim 17, wherein a gap is present between the discrete island structure and horizontal portions of the first and second foundation layers.

20. The method as recited in claim 17, further comprising forming an insulating layer along the side wall of the sensor stack prior to forming the first foundation layer, wherein the sensor stack includes a tunnel barrier layer.

21. The method as recited in claim 17, wherein a film thickness of the first foundation layer at the position along the side wall of the sensor stack is not greater than 0.2 nm.

22. The method as recited in claim 21, wherein the film thickness is not less than 0.1 nm.

23. The method as recited in claim 17, wherein the first foundation layer includes a material selected from a group consisting of NiTa, CrMo, CoCrPt, Cr and NiFe.

24. The method as recited in claim 17, wherein an easy axis of magnetization of an end portion of the hard bias layer positioned closest to the sensor stack is oriented in about a direction of magnetization of the free layer.

* * * * *

UNITED STATES PATENT AND TRADEMARK OFFICE
CERTIFICATE OF CORRECTION

PATENT NO. : 8,964,336 B2  
APPLICATION NO. : 13/605934  
DATED : February 24, 2015  
INVENTOR(S) : Norihiro Okawa et al.

Page 1 of 1

It is certified that error appears in the above-identified patent and that said Letters Patent is hereby corrected as shown below:

In the Specification:

col. 3, line 7 replace "5C" with --8C--;

col. 4, line 63 replace "hearing" with --bearing--;

col. 6, line 38 replace "48," with --4B,--;

col. 10, line 58 replace "8A-81," with --8A-8I,--;

col. 11, line 7 replace "8I," with --8H,--;

col. 11, line 20 replace "90e" with --900--;

col. 12, line 1 replace "68)" with --6B)--.

Signed and Sealed this  
Seventh Day of July, 2015

Michelle K. Lee  
*Director of the United States Patent and Trademark Office*